United States Patent
Kim et al.

(10) Patent No.: US 12,041,798 B2
(45) Date of Patent: Jul. 16, 2024

(54) DISPLAY PANEL

(71) Applicant: Samsung Display Co., Ltd., Yongin-si (KR)

(72) Inventors: Hyeongpil Kim, Osan-si (KR); Byoung-Hun Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 396 days.

(21) Appl. No.: 17/448,162

(22) Filed: Sep. 20, 2021

(65) Prior Publication Data

US 2022/0190274 A1    Jun. 16, 2022

(30) Foreign Application Priority Data

Dec. 15, 2020    (KR) .................. 10-2020-0175784

(51) Int. Cl.
 *H10K 59/38* (2023.01)
 *H10K 30/80* (2023.01)
 *H10K 59/122* (2023.01)

(52) U.S. Cl.
 CPC ......... *H10K 30/865* (2023.02); *H10K 59/122* (2023.02); *H10K 59/38* (2023.02)

(58) Field of Classification Search
 CPC .... H10K 59/35; H10K 59/353; H10K 59/122; H10K 59/32; H10K 50/19
 See application file for complete search history.

(56) References Cited

U.S. PATENT DOCUMENTS

| | | | |
|---|---|---|---|
| 8,283,054 B2 | 10/2012 | Spindler et al. | |
| 2009/0195146 A1 | 8/2009 | Hatwar et al. | |
| 2016/0254323 A1 | 9/2016 | Wang et al. | |
| 2018/0019286 A1* | 1/2018 | Oh ......................... | H10K 99/00 |
| 2020/0035948 A1* | 1/2020 | Song ...................... | H10K 50/82 |
| 2020/0044178 A1 | 2/2020 | Lim et al. | |
| 2020/0388651 A1* | 12/2020 | Woo ...................... | H10K 50/125 |
| 2021/0028383 A1* | 1/2021 | Manders .............. | H10K 50/115 |
| 2021/0175456 A1* | 6/2021 | Song ...................... | H10K 50/15 |

FOREIGN PATENT DOCUMENTS

KR    10-2020-0014045 A    2/2020

* cited by examiner

*Primary Examiner* — Evan G Clinton
(74) *Attorney, Agent, or Firm* — Lewis Roca Rothgerber Christie LLP

(57) ABSTRACT

A display panel includes an upper display substrate in which first to third pixel regions respectively configured to emit first to third light are defined, and a lower display substrate including first to third light-emitting elements respectively overlapping the first to third pixel regions. The first light-emitting element and the second light-emitting element each include one or more first stack parts and one or more first charge generation layers, each of the one or more first stack parts including a first emission layer configured to emit the second light. The third light-emitting element includes one or more second stack parts and one or more second charge generation layers, each of the one or more second stacking parts including a second emission layer configured to emit the third light. The first charge generation layer includes organic dopants, and the second charge generation layer includes inorganic dopants.

20 Claims, 7 Drawing Sheets

DISPLAY PANEL

CROSS-REFERENCE TO RELATED APPLICATIONS

This application claims priority to and the benefit of Korean Patent Application No. 10-2020-0175784, filed on Dec. 15, 2020, the entire content of which is hereby incorporated by reference.

BACKGROUND

1. Field

The present disclosure herein relates to a display panel, and more particularly, to a display panel including a light-emitting element having improved lifetime (lifespan) and luminous efficiency.

2. Description of the Related Art

Various suitable display devices utilized (e.g., used) for multimedia devices (such as televisions, mobile phones, tablet computers, navigation systems, and game consoles) are being developed. As a display device, a so-called self-luminescent display element, which performs display by causing a light emitting material to emit light, may be utilized (e.g., used).

Specifically, a light-emitting element generates excitons by recombining, in an emission layer, holes and electrons injected from a first electrode and a second electrode, respectively, and generates light by dropping the generated excitons to a ground state.

A tandem organic light-emitting element has, between an anode electrode and a cathode electrode, a structure including a plurality of stacks, for example, at least two stacks, each of the stacks including hole-injecting layer/hole-transport layer/emission layer/electron-transport layer/electron-injecting layer, and a charge generation layer for assisting in generation and movement of charges is arranged (present) between the respective stacks.

SUMMARY

Aspects of embodiments of the present disclosure are directed towards a display panel including a light-emitting element having improved lifetime (lifespan) and luminous efficiency.

An embodiment of the present disclosure provides a display panel including: an upper display substrate in which a first pixel region configured to emit first light, a second pixel region configured to emit second light different from the first light, and a third pixel region configured to emit third light different from the first light and the second light are defined; and a lower display substrate including a first light-emitting element overlapping the first pixel region, a second light-emitting element overlapping the second pixel region, and a third light-emitting element overlapping the third pixel region, wherein the first light-emitting element and the second light-emitting element each include one or more first stack parts and one or more first charge generation layers, each of the one or more first stack parts including a first emission layer configured to emit the second light, the third light-emitting element includes one or more second stack parts and one or more second charge generation layers, each of the one or more second stack parts including a second emission layer configured to emit the third light, the first charge generation layer includes an organic dopant, and the second charge generation layer includes an inorganic dopant.

In an embodiment, each of the one or more first charge generation layers may include a p-type (e.g., p-doped) first charge generation layer and an n-type (e.g., n-doped) first charge generation layer, each of the one or more second charge generation layers may include a p-type (e.g., p-doped) second charge generation layer and an n-type (e.g., n-doped) second charge generation layer, the p-type first charge generation layer may include the organic dopant, and the p-type second charge generation layer may include the inorganic dopant.

In an embodiment, the organic dopant may include (e.g., be) at least one selected from 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), 1,4,5,8,9,11-hexaazatriphenylene-hexacarbonitrile (HAT-CN), 2,3,5,6-tetrafluoro-7,7,8,8-tetracyanoquinodimethane (F4-TCNQ), and tetracyanoquinodimethane (TCNQ).

In an embodiment, the inorganic dopant may include (e.g., be) at least one selected from a post-transition metal, a metalloid, a compound of a post-transition metal and a metalloid, and a compound of a post-transition metal and a halogen.

In an embodiment, each of the one or more first stack parts may further include a first hole-transport region under the first emission layer, and a first electron-transport region on the first emission layer, and each of the one or more second stack parts may further include a second hole-transport region under the second emission layer, and a second electron-transport region on the second emission layer.

In an embodiment, the lower display substrate may further include a bank between the second light-emitting element and the third light-emitting element, and the bank may not be between the first light-emitting element and the second light-emitting element.

In an embodiment, a non-pixel region adjacent to each of the first to third pixel regions may be further defined in the upper display substrate, the lower display substrate may further include a pixel-defining film overlapping the non-pixel region, and the bank may overlap the pixel-defining film.

In an embodiment, each of the one or more first stack parts of the first light-emitting element and each corresponding one of the one or more first stack parts of the second light-emitting element may have an integrated shape (e.g., be an integral body).

In an embodiment, the first light-emitting element and the second light-emitting element may each further include one or more second stack parts and one or more second charge generation layers, each of the one or more second stack parts of each of the first and second light-emitting elements including a second emission layer configured to emit the third light.

In an embodiment, the upper display substrate may include a first light-controlling part overlapping the first pixel region and including a first quantum dot, a second light-controlling part overlapping the second pixel region and to transmit the second light, and a third light-controlling part overlapping the third pixel region and to transmit the third light, and the first quantum dot may convert the second light to the first light.

In an embodiment, the upper display substrate may include a first light-controlling part overlapping the first pixel region and including a first quantum dot, a second light-controlling part overlapping the second pixel region and including a second quantum dot, and a third light-controlling part overlapping the third pixel region and to transmit the third light, the first quantum dot may convert the second light or the third light to the first light, and the second quantum dot may convert the third light to the second light.

In an embodiment, at least one second stack part of the one or more second stack parts of the first light-emitting element and at least one corresponding second stack part of the one or more second stack parts of the second light-emitting element may have a shape integrated with at least one corresponding second stack part of the one or more second stack parts of the third light-emitting element.

In an embodiment, the third light-emitting element may not include a first stack part including a first emission layer configured to emit the second light.

In an embodiment, the first light-emitting element may be the same as the second light-emitting element in structure.

In an embodiment, the first light may be red light, the second light may be green light, and the third light may be blue light.

In an embodiment of the present disclosure, a display panel includes: an upper display substrate in which a first pixel region, a second pixel region, and a third pixel region are defined and are arranged adjacent in a first direction; and a lower display substrate including a first light-emitting element overlapping the first pixel region, a second light-emitting element overlapping the second pixel region, a third light-emitting element overlapping the third pixel region, and a bank between the second light-emitting element and the third light-emitting element, wherein the first light-emitting element and the second light-emitting element each include at least one first stack part, each of the at least one first stack part including a first emission layer configured to emit a second light, the third light-emitting element includes at least two second stack parts, each of the at least two second stack parts including a second emission layer configured to emit a third light different from the second light, and the third light-emitting element does not include a first stack part comprising a first emission layer configured to emit the second light.

In an embodiment, the lower display substrate may further include a p-type first charge generation layer under the first emission layer, and a p-type second charge generation layer under the second emission layer, the p-type first charge generation layer may include an organic dopant, and the p-type second charge generation layer may include an inorganic dopant.

In an embodiment, the lower display substrate may further include an n-type first charge generation layer on the first emission layer, and an n-type second charge generation layer on the second emission layer.

In an embodiment, each of the first to third light-emitting elements includes first-layer to third-layer stacks sequentially stacked in a second direction orthogonal to the first direction, the first-layer to third-layer stacks of each of the first light-emitting element and the second light-emitting element may each include a first stack part, each of the first stack parts of the first-layer to third layer stacks of the first light-emitting element having an integrated shape with a corresponding one of the first stack parts of the first-layer to third-layer stacks of the second light-emitting element, and the first-layer to third-layer stacks of the third light-emitting element may each include a second stack part.

In an embodiment, each of the first to third light-emitting elements may include: first-layer to third-layer layer stacks sequentially stacked in a second direction orthogonal to the first direction, at least one layer selected from the first-layer to third-layer stacks of each of the first light-emitting element and the second light-emitting element may include a second stack part including a second emission layer configured to emit the third light, and the other layers of the first-layer to third-layer stacks of each of the first light-emitting element and the second light-emitting element may include a corresponding one of the at least one first stack part; and the first-layer to third-layer stacks of the third light-emitting element each may include a corresponding one of the at least two second stack part.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
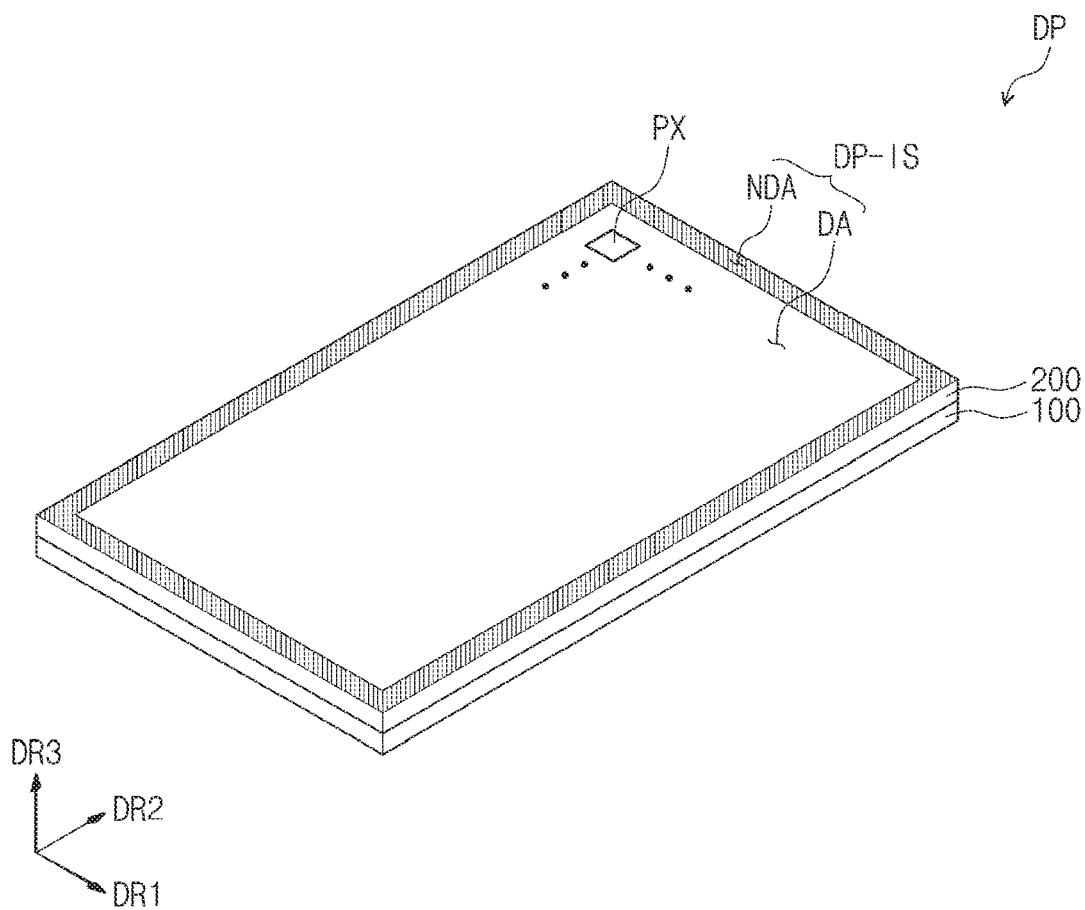
FIG. 1 is a perspective view of a display panel according to an embodiment of the present disclosure.

In the present disclosure, various suitable modifications may be made and various suitable forms may be applied, and specific embodiments will be illustrated in the drawings and described in more detail in the text. However, this is not intended to limit the present disclosure to a specific disclosure form, and it should be understood to include all suitable changes, equivalents, and substitutes included in the spirit and scope of the present disclosure.

In describing each drawing, similar reference numerals have been used for similar elements. In the accompanying drawings, the dimensions of the structures may be exaggerated for clarity of the present disclosure. Terms such as first and second may be used to describe various components, but the components should not be limited by the terms. These terms are used only for the purpose of distinguishing one component from another component. For example, without departing from the scope of the present disclosure, a first component may be referred to as a second component, and similarly, a second component may be referred to as a first component. Singular expressions include plural expressions unless the context clearly indicates otherwise. As used herein, the use of the term "may," when describing embodiments of the present disclosure, refers to "one or more embodiments of the present disclosure."

As used herein, "and/or" includes any and all combinations of one or more of the listed items.

The terms "about," "approximately," and similar terms, when used herein in connection with a numerical value or a numerical range, are inclusive of the stated value and mean within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. In addition, terms such as terms defined in commonly used dictionaries should be interpreted as having a meaning consistent with the meaning in the context of the related technology, and should not be interpreted to have an idealized or excessively formal meaning, unless explicitly defined herein.

In the present application, terms such as "comprise," "include," "have," and similar terms are intended to designate the presence of features, numbers, steps, actions, components, parts, and/or combinations thereof described in the specification. It should be understood that the possibility of the presence and/or addition of one or more other features, numbers, steps, actions, components, parts, and/or combinations thereof should not precluded.

In the present application, when a part such as a layer, film, region, plate, etc. is said to be "on" another part, it includes not only "directly above" or "directly on" another part, but also includes embodiments where one or more additional part(s) is therebetween. When a part such as a layer, film, region, or plate is said to be "under" another part, this includes not only the case where the other part is "directly below" the part, but also the case where there is one or more additional part(s) therebetween. In addition, in the present specification, the term "above" may include a case where a first part is disposed not only at the top of a second part, but also cases where the first part is at the bottom of the second part.

Meanwhile, in the present application, "directly in contact" may refer to there being no layer, film, region, plate, etc. between a portion such as a layer, film, region, or plate and another portion. For example, "direct contact" may refer to placing two layers or two members without using (e.g., including) one or more additional member(s), such as an adhesive member, therebetween.

Hereinafter, a display panel according to an embodiment of the present disclosure will be explained with reference to the accompanying drawings.

Figure 2:
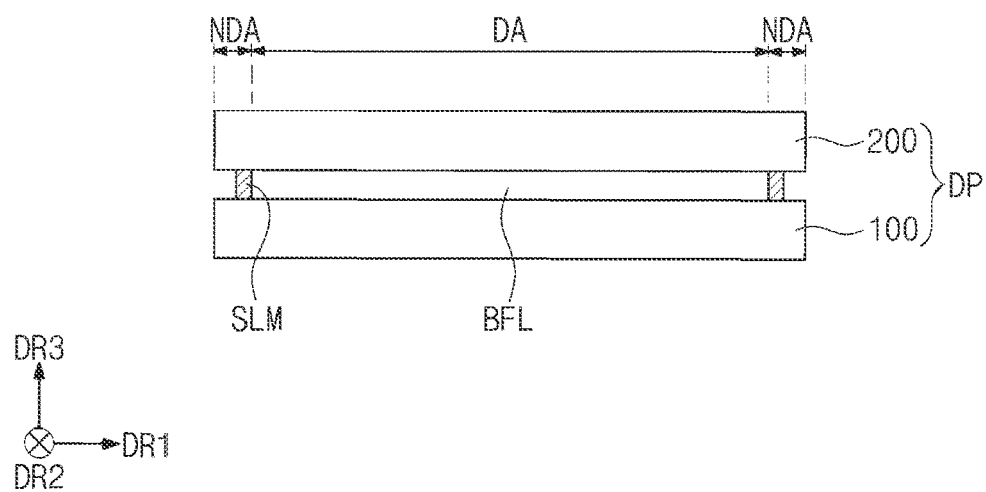
FIG. 2 is a cross-sectional view of a display panel according to an embodiment of the present disclosure.

FIG. 1 is a perspective view of a display panel DP according to an embodiment of the present disclosure. FIG. 2 is a cross-sectional view of a display panel DP according to an embodiment of the present disclosure.

Referring to FIGS. 1 and 2, a display panel DP may include a lower display substrate 100 and an upper display substrate 200 facing (e.g., overlapping) and spaced apart from the lower display substrate 100. A filling layer BFL may be filled between the lower display substrate 100 and the upper display substrate 200. In some embodiments, the filling layer BFL may be omitted in the display panel DP according to an embodiment, and a set or predetermined cell gap may be defined between the lower display substrate 100 and the upper display substrate 200.

In some embodiments, the display panel DP may further include a chassis member or a molding member, and the display panel DP may further include a backlight unit according to the type (e.g., kind) of the display panel DP.

The display panel DP according to an embodiment may include a sealant SLM configured to couple (e.g., combine) the lower display substrate 100 and the upper display substrate 200 in a non-display region NDA. The sealant SLM may include (e.g., be) an organic adhesive member and/or an inorganic adhesive member. The sealant SLM may include (e.g., be) a frit. However, an embodiment of the present disclosure is not limited thereto, and, in some embodiments, the sealant SLM may be omitted.

The display panel DP may display images through a display surface DP-IS. The display surface DP-IS is parallel to a plane defined by a first direction DR1 and a second direction DR2. The display surface DP-IS may include a display region DA and the non-display region NDA. A pixel PX is disposed in the display region DA. The non-display region NDA may be defined along the border of the display surface DP-IS. The display region DA may be surrounded (e.g., partially or entirely surrounded) by the non-display region NDA. In some embodiments, the non-display region NDA may be around the display region DA.

The normal direction of the display surface DP-IS, for example, the thickness direction of the display panel DP, is indicated by a third direction DR3. A front surface (or an upper surface) and a rear surface (or a lower surface) of each layer or unit described hereinafter are defined by the third direction DR3. However, the first to third directions DR1, DR2 and DR3 shown in the present embodiment are just examples.

The display panel DP including the planar display surface DP-IS is illustrated in an embodiment of the present disclosure, but is not limited thereto. The display panel DP may include a curved display surface or a cubic display surface. The cubic display surface may include a plurality of display regions indicating directions different from each other.

The display panel DP may be at least one selected from among a liquid crystal display panel, an electrophoretic display panel, a microelectromechanical system (MEMS) display panel, an electrowetting display panel, an organic light-emitting display panel, a micro LED display panel, a quantum dot display panel, and a quantum rod display panel, but the present disclosure is not particularly limited thereto.

Figure 3:
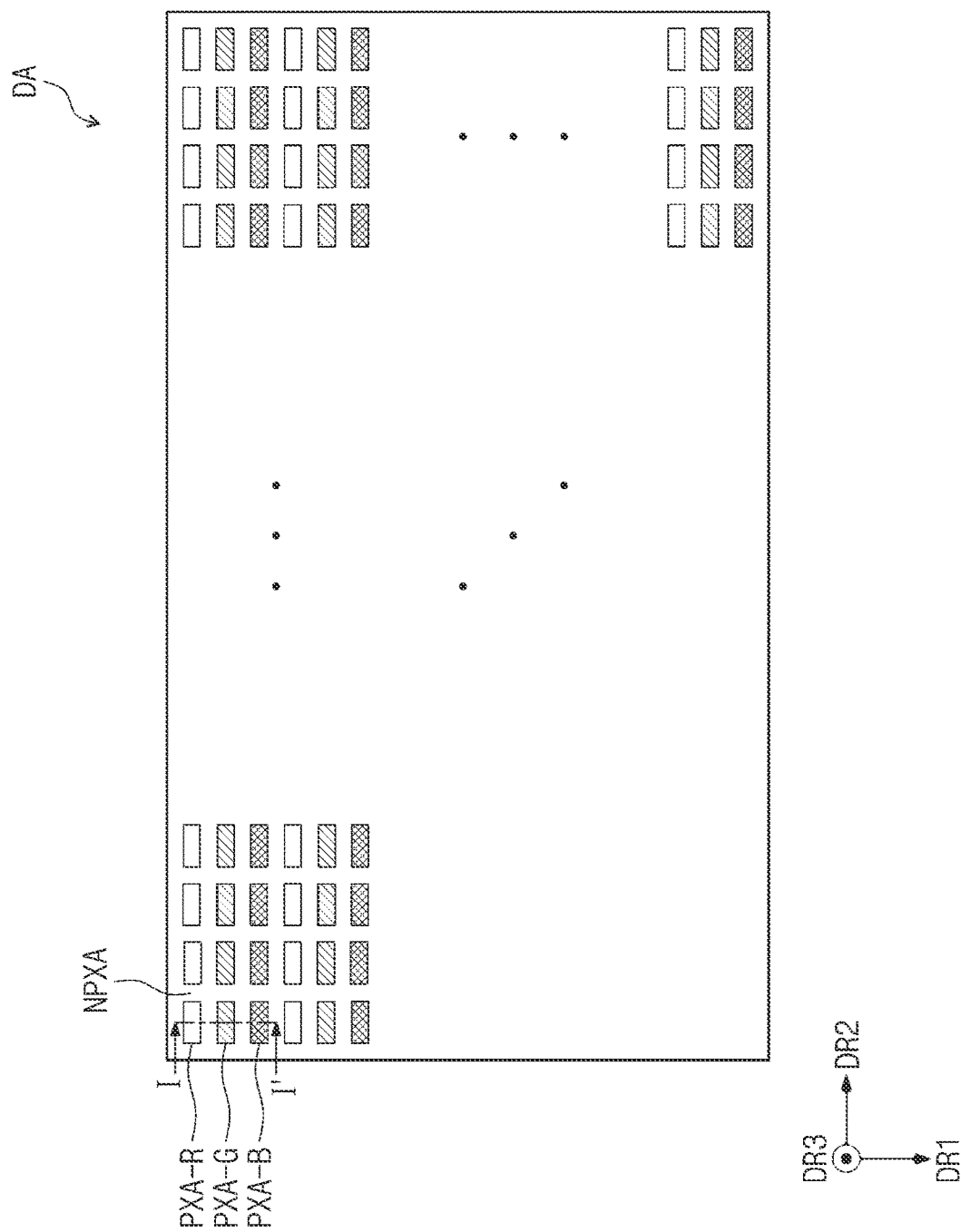
FIG. 3 is a plan view of a display region of a display panel according to an embodiment of the present disclosure.
Figure 4:
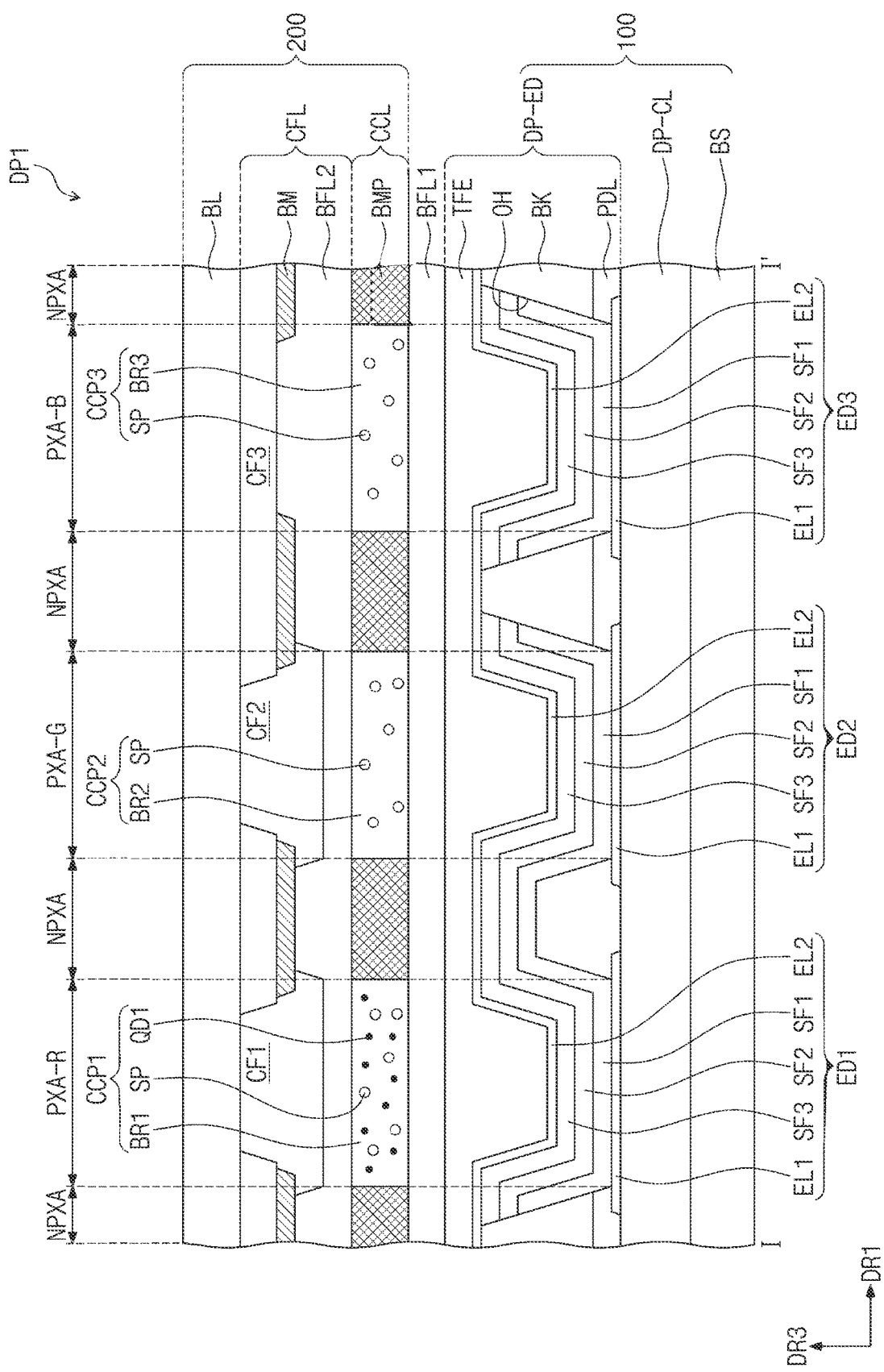
FIG. 4 is a cross-sectional view of a display panel according to an embodiment.

FIG. 3 is a plan view of a display region DA of a display panel DP according to an embodiment of the present disclosure. FIG. 4 is a cross-sectional view of a display panel DP of an embodiment. FIG. 4 is a cross-sectional view taken along line I-I' of FIG. 3.

Referring to FIG. 3, a non-pixel region NPXA and pixel regions PXA-R, PXA-G, and PXA-B may be defined in a display region DA of a display panel DP. A stripe structure in which the pixel regions PXA-R, PXA-G, and PXA-B are arranged with each other alternately in sequence is illustrated, but the arrangement structure of the pixel regions PXA-R, PXA-G, and PXA-B is not limited thereto and may have various suitable array forms. In an embodiment, the pixel regions PXA-R, PXA-G, and PXA-B may have a diamond arrangement structure, or a PENTILE® (Trademark of Samsung Display Co., Ltd.) type (e.g., kind) arrangement structure. For example, the pixel regions PXA-R, PXA-G, and PXA-B may be arranged in an RGBG matrix structure.

The pixel regions PXA-R, PXA-G, and PXA-B may include a first pixel region PXA-R, a second pixel region PXA-G, and a third pixel region PXA-B which are spaced apart from each other. The first to third pixel regions PXA-R, PXA-G, and PXA-B having a rectangular shape in FIG. 3 are shown when viewed from the top (e.g., from a plan view), but the planar shape of the first to third pixel regions PXA-R, PXA-G, and PXA-B are not limited thereto. In a plane (e.g., a plan view), the first to third pixel regions PXA-R, PXA-G, and PXA-B may have different polygonal shapes, and may have a regular polygonal shape with a rounded corner region.

The non-pixel region NPXA is disposed around or surrounding (e.g., partially or entirely surrounding) the first to third pixel regions PXA-R, PXA-G, and PXA-B. The non-pixel region NPXA sets boundaries between the first to third pixel regions PXA-R, PXA-G, and PXA-B, to thereby prevent or reduce color mixing between the first to third pixel regions PXA-R, PXA-G, and PXA-B. Also, the non-pixel region NPXA blocks source light so that the source light is not provided to a user.

Referring to FIG. 4, the lower display substrate 100 of the display panel DP may include a base layer BS, and a circuit layer DP-CL and a display element layer DP-ED which are provided on the base layer BS. In some embodiments, the display element layer DP-ED is on the circuit layer DP-CL. The display element layer DP-ED may include a pixel-defining film PDL, and light-emitting elements ED1, ED2, and ED3 disposed overlapping openings OH defined in the pixel-defining film PDL.

The pixel-defining film PDL may distinguish (e.g., define) the pixel regions PXA-R, PXA-G, and PXA-B. For example, the pixel regions PXA-R, PXA-G, and PXA-B may be defined by the openings in the pixel-defining film PDL. The non-pixel regions NPXA may be regions between adjacent pixel regions PXA-R, PXA-G, and PXA-B, and the non-pixel regions NPXA may correspond to the pixel-defining film PDL.

The light-emitting elements ED1, ED2, and ED3 are disposed overlapping the pixel regions PXA-R, PXA-G, and PXA-B. The pixel regions PXA-R, PXA-G, and PXA-B may be regions in which light generated from the light-emitting elements ED1, ED2, and ED3 are emitted respectively.

For example, the display panel DP includes the first pixel region PXA-R, the second pixel region PXA-G, and the third pixel region PXA-B which are spaced apart from each other, and the display panel DP includes a first light-emitting element ED1 overlapping the first pixel region PXA-R, a second light-emitting element ED2 overlapping the second pixel region PXA-G, and a third light-emitting element ED3 overlapping the third pixel region PXA-B.

In an embodiment, the first pixel region PXA-R may be a red light pixel area. The red light may correspond to light having a wavelength range of about 625 nm to about 675 nm. The second pixel region PXA-G may be a green light pixel area. The green light may correspond to light having a wavelength range of about 500 nm to about 570 nm. The third pixel region PXA-B may be a blue light pixel area. The blue light may correspond to light having a wavelength of about 410 nm to about 480 nm.

In the display panel DP of an embodiment, the first light-emitting element ED1 and the second light-emitting element ED2 may emit light having the same wavelength range, and the third light-emitting element ED3 may emit light of which the wavelength range is different from those of the first light-emitting element ED1 and the second light-emitting element ED2. For example, the first light-emitting element ED1 and the second light-emitting element ED2 may emit green light, and the third light-emitting element ED3 may emit blue light. Although an embodiment of the present disclosure is not limited thereto, the first light-emitting element ED1 and the second light-emitting element ED2 may emit green light and blue light. In some embodiments, the first light-emitting element ED1 may emit green light and/or blue light, and the second light-emitting element ED2 may emit green light and/or blue light.

Although FIGS. 3 and 4 illustrate that all of the pixel regions PXA-R, PXA-G, and PXA-B have similar areas, an embodiment is not limited thereto. Thus, the areas of the pixel regions PXA-R, PXA-G, and PXA-B may be different from each other, for example, according to the wavelength region of emitted light. Meanwhile, the areas of the pixel regions PXA-R, PXA-G, and PXA-B may refer to areas on the plane defined by the first direction DR1 and the second direction DR2. For example, the areas of the pixel regions PXA-R, PXA-G, and PXA-B may refer to planar areas.

The base layer BS may be a member providing a base surface on which the display element layer DP-ED is disposed. The base layer BS may include (e.g., be) a glass substrate, a metal substrate, and/or a plastic substrate. However, an embodiment is not limited thereto. In some embodiments, the base layer BS may be an inorganic layer, an organic layer, or a composite material layer.

In an embodiment, the circuit layer DP-CL may be disposed on the base layer BS, and the circuit layer DP-CL may include a plurality of transistors. The transistors may each include a control electrode (e.g., a gate electrode), an input electrode and an output electrode. For example, the circuit layer DP-CL may include a switching transistor and a driving transistor which are configured to drive the first to third light-emitting elements ED1, ED2, and ED3.

The pixel-defining film PDL may be disposed on the circuit layer DP-CL. The pixel-defining film PDL may be formed of a polymer resin. For example, the pixel-defining film PDL may include (e.g., be) a polyacrylate-based resin and/or a polyimide-based resin. Also, the pixel-defining film PDL may further include (e.g., be) an inorganic material in addition to the polymer resin. Meanwhile, the pixel-defining film PDL may include (e.g., be) a light-absorbing material, or may include (e.g., be) a black pigment and/or black dye. The pixel-defining film PDL including (e.g., being) the black pigment and/or black dye may form a black pixel-defining film. Carbon black and/or the like as the black pigment and/or black dye may be utilized (e.g., used) in forming the pixel-defining film PDL, but an embodiment is not limited thereto.

In addition, the pixel-defining film PDL may be formed of an inorganic material. For example, the pixel-defining film PDL may be formed including (e.g., being) $SiN_x$, $SiO_x$, $SiO_xN_y$, etc.

The first to third light-emitting elements ED1, ED2, and ED3 may be distinguished (e.g., spaced apart in the plan view) by the pixel-defining film PDL.

Figure 5:
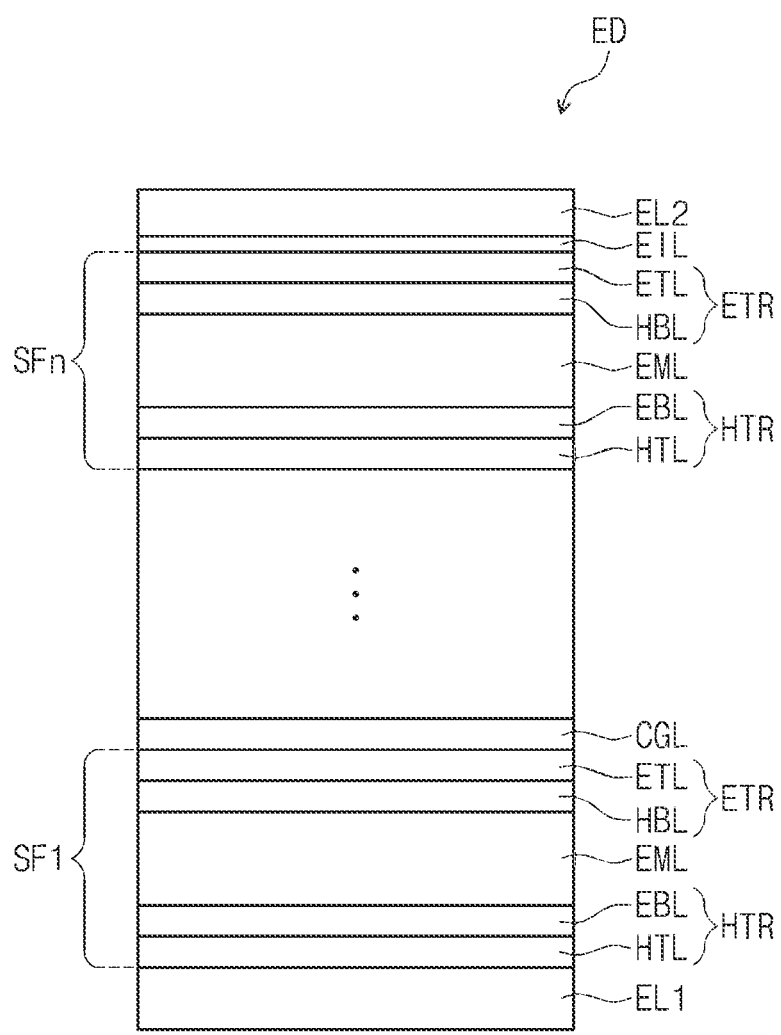
FIG. 5 is a cross-sectional view of a light-emitting element according to an embodiment.

The first to third light-emitting element ED1, ED2, and ED3 may each include a first electrode EL1 and a second electrode EL2 which face (e.g., overlap) each other, and a plurality of stack layers SF1, SF2, and SF3 (also referred to as "layer stacks") which are stacked in the third direction DR3 between the first electrode EL1 and the second electrode EL2. The plurality of stack layers SF1, SF2, and SF3 may each include a hole-transport region HTR (FIG. 5), an emission layer EML (FIG. 5) and an electron-transport region ETR (FIG. 5). In some embodiments, a light-emitting element included in the display panel DP of an embodiment may be a tandem-structured light-emitting element including a plurality of emission layers. Meanwhile, FIG. 4 illustrates that the first to third light-emitting elements ED1, ED2, and ED3 each include a first stack SF1, a second stack SF2, and a third stack SF3, but an embodiment is not limited thereto.

In an embodiment, the plurality of stack layers SF1, SF2, and SF3 included in the first light-emitting element ED1 and the second element ED2 may have the same structure and material. Meanwhile, the third light-emitting element ED3 may include at least one stack layer SF1, SF2, and SF3, which are different in structure and/or material from each other when compared with the pluralities of stack layers SF1, SF2, and SF3 included in the first light-emitting element ED1 and the second light-emitting element ED2. In some embodiments, one or more of the plurality of stack layers SF1, SF2, and SF3 of the third light-emitting element ED3 may be different in structure and/or material from corresponding ones of one or more of the plurality of stack layers SF1, SF2, and SF3 of the first and second light emitting elements ED1 and ED2. This will be described later in more detail referring to FIGS. 6 and 8.

A bank BK may be disposed on the boundary of the third light-emitting element ED3. For example, the bank BK may be disposed between the first light-emitting element ED1 and the third light-emitting element ED3. The bank BK may be disposed between the second light-emitting element ED2 and the third light-emitting element ED3. The third light-emitting element ED3 may include stack layers SF1, SF2, and SF3 which are distinguished from those of the first light-emitting element ED1 and the second light-emitting element ED2 by utilizing (e.g., using) the bank BK. In some embodiments, the bank BK may be around or surround (e.g., partially or entirely surround) the third light-emitting element ED3. In some embodiments, the stack layers SF1, SF2, and SF3 of the third light-emitting element ED3 may be separated from the stack layers SF1, SF2, and SF3 of the second light-emitting element ED2 and/or the first light-emitting element ED1. In some embodiments, the bank BK may not be between the first and second light-emitting elements ED1 and ED2, and the bank BK may not separate the stack layers SF1, SF2, and SF3 of the first light-emitting element ED1 from the stack layers SF1, SF2, and SF3 of the second light-emitting element ED2.

In an embodiment, the bank BK may be disposed on the pixel-defining film PDL, and may overlap the pixel-defining film PDL. The bank BK may include (e.g., be) the same material as, or different materials from, the pixel-defining film PDL. For example, the bank BK may include (e.g., be) a liquid-repellent material. The bank BK may be a layer distinguished from the pixel-defining film PDL, or may have a shape integrated with the pixel-defining film PDL.

A sealing layer TFE may be disposed on the first to third light-emitting elements ED1, ED2, and ED3. The sealing layer TFE may cover the first to third light-emitting element ED1, ED2, and ED3. The sealing layer TFE may seal the display element layer DP-ED. The sealing layer TFE may be a thin film-sealing layer. The sealing layer TFE may be a single layer or a plurality of layers stacked. The sealing layer TFE includes at least one insulating layer. The sealing layer TFE according to an embodiment may include at least one inorganic film (hereinafter, a sealing inorganic film). In addition, the sealing layer TFE according to an embodiment may include at least one organic film (hereinafter, a sealing organic film), and at least one sealing inorganic film.

The sealing inorganic film protects the display element layer DP-ED from moisture and/or oxygen, and the sealing organic film protects the display element layer DP-ED from foreign substances such as dust particles. The sealing inorganic film may include (e.g., be) silicon nitride, silicon oxynitride, silicon oxide, titanium oxide, aluminum oxide, etc., but is not limited thereto. The sealing organic film may include (e.g., be) an acrylic compound, an epoxy-based compound, etc. The sealing organic film may include (e.g., be) a photopolymerizable organic material but is not limited thereto.

A first filling layer BFL1 may be disposed on the sealing layer TFE. The first filling layer BFL1 may be disposed between the lower display substrate 100 and the upper display substrate 200 to prevent or block the configuration of a light-controlling layer CCL and/or the like included in the upper display substrate 200 from contacting the sealing layer TFE of the lower display substrate 100, and the first filling layer BFL1 may improve light extraction efficiency of the display panel DP. The first filling layer BFL1 may cover the upper surface of the sealing layer TFE.

FIG. 4 illustrates that the first filling layer BFL1 is filled between the lower display substrate 100 and the upper display substrate 200, but an embodiment of the present disclosure is not limited thereto. The first filling layer BFL1 may be omitted in the display panel DP according to an embodiment of the present disclosure. In this case, a set or predetermined cell gap may be defined between the lower display substrate 100 and the upper display substrate 200.

The upper display substrate 200 of the display panel DP may include a base substrate BL, a color filter layer CFL, and a light-controlling layer CCL. The upper display substrate 200 may be disposed on the sealing layer TFE.

The light-controlling layer CCL may be disposed on the lower display substrate 100. The light-controlling layer CCL may include a light-converting body. The light-converting body may be a quantum dot and/or a fluorescent body, etc. The light-converting body may convert the wavelength of provided light and emit light with a converted wavelength. In some embodiments, the light-controlling layer CCL may be a layer including a quantum dot and/or a layer including a fluorescent body.

In an embodiment, the quantum dot may include, as a core, a group II-VI compound, a group III-VI compound, a group I-III-VI compound, a group III-V compound, a group III-II-V compound, a group IV-VI compound, a group IV element, a group IV compound, and/or a combination thereof.

The group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include (e.g., be) a binary compound such as $In_2S_3$ and/or $In_2Se_3$; a ternary compound such as $InGaS_3$ and/or $InGaSe_3$; or any combination thereof.

The group I-III-VI compound may be a ternary compound including (e.g., being) AgInS, $AgInS_2$, CuInS, $CuInS_2$, $AgGaS_2$, $CuGaS_2$, $CuGaO_2$, $AgGaO_2$, $AgAlO_2$, and/or a mixture thereof, and/or a quaternary compound such as $AgInGaS_2$ and/or $CuInGaS_2$.

The group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Meanwhile, the group III-V compound may further include (e.g., be) a group II metal. For example, InZnP, InGaZnP, and/or InAlZnP may be selected as a group III-II-V compound.

The group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of silicon (Si), germanium (Ge), and a mixture thereof. The group IV compound may be a binary compound selected from the group consisting of SiC, SiGe, and a mixture thereof.

Here, the binary compound, the ternary compound, and/or the quaternary compound may be present with a uniform concentration in a particle, or separately present, in the same particle, with a partially different concentration distribution. In some embodiments, the concentration of the binary compound, the ternary compound, and/or the quaternary compound may be uniform of non-uniform. In addition, a core/shell structure in which one quantum dot is around or surrounds (e.g., partially or entirely surrounds) another quantum dot may be provided. The core/shell structure has a concentration gradient in which the concentration of an element present in a shell may decrease toward a core.

The shell of the quantum dot may serve as a protective layer for maintaining semiconductor properties by preventing or reducing the chemical modification of the core and/or a charging layer for imparting electrophoretic properties to the quantum dot. The shell may be a single layer or a multilayer. Example of the shell of the quantum dot may include (e.g., be) an oxide of a metal, an oxide of a non-metal, a semiconductor compound, or a combination thereof.

For example, examples of the oxide of metal and/or the oxide of non-metal may include (e.g., be) a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but an embodiment of the present disclosure is not limited thereto.

Also, examples of the semiconductor compound may include (e.g., be) CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the present disclosure is not limited thereto.

The full width of half maximum (FWHM) of the emitted light wavelength spectrum of the quantum dot may be at most about 45 nm, preferably at most about 40 nm, and more preferably at most about 30 nm, and the color purity and/or color reproducibility may be improved in this range. In addition, because light emitted through the quantum dot is emitted omnidirectionally, wide viewing angle may be improved.

In addition, the quantum dot may have a shape commonly utilized (e.g., used) or generally available in the field, and is thus not particularly limited. In some embodiments, the quantum dot may be utilized (e.g., used) in the form of a spherical particle, a pyramidal particle, a multi-arm-shaped particle, a cubic nanoparticle, a nanotube particle, a nanowire particle, a nanofiber particle, a nanoplatelet particle, and/or the like.

The quantum dot may control the color of emitted light according to a particle size, and the quantum dot may have various suitable emitted light colors such as red, green, and blue.

The light-controlling layer CCL may include a scattering body SP. The scattering body SP may scatter light, and may be, for example, inorganic particles. In an embodiment, the scattering body SP may include (e.g., be) at least one of $TiO_2$, ZnO, $Al_2O_3$, $SiO_2$, or hollow silica. The scattering body SP may include (e.g., be) any one of $TiO_2$, ZnO, $Al_2O_3$, $SiO_2$, or hollow silica, or a mixture of at least two selected from among $TiO_2$, ZnO, $Al_2O_3$, $SiO_2$, and hollow silica. In another embodiment of the present disclosure, the scattering body SP may be omitted.

The light-controlling layer CCL may include a base resin BR1, BR2, and BR3 in which the quantum dot and/or the scattering body SP are dispersed. The base resin BR1, BR2, and BR3 is a medium in which the quantum dot and/or the scattering body SP are dispersed, and may be composed of various suitable resin compositions which may be generally called a binder. For example, the base resin BR1, BR2, and BR3 may include (e.g., be) an acrylic resin, a urethane-based resin, a silicone-based resin, and/or an epoxy-based resin, etc. The base resin BR1, BR2, and BR3 may include (e.g., be) a transparent resin. In an embodiment, a first base resin BR1, a second base resin BR2, and a third base resin BR3 may be the same as or different from each other.

The light-controlling layer CCL may include a plurality of light-controlling parts CCP1, CCP2, and CCP3. The light-controlling parts CCP1, CCP2, and CCP3 may be spaced apart from each other. As illustrated in the drawing, split patterns BMP may be disposed between the light-controlling parts CCP1, CCP2, and CCP3 spaced apart from each other, but an embodiment is not limited thereto. The split patterns BMP are illustrated not to overlap the light-controlling parts CCP1, CCP2, and CCP3, but the edges of the light-controlling parts CCP1, CCP2, and CCP3 may overlap at least some of the split patterns BMP.

The light-controlling layer CCL may include a first light-controlling part CCP1, a second light-controlling part CCP2, and a third light-controlling part CCP3, each of which transmits or converts light provided by the lower display substrate 100. For example, the first light (e.g., the light emitted from the first light-controlling part CCP1) may be red light, the second light (e.g., the light emitted from the second light-controlling part CCP2) may be green light, and the third light (e.g., the light emitted from the third light-controlling part CCP3) may be blue light.

Referring to FIG. 4, the first light-controlling part CCP1 may convert the second light or the third light to the first light. The first light-controlling part CCP1 may include a first quantum dot QD1 and a scattering body SP dispersed in the first base resin BR1. The first quantum dot QD1 may convert the second light or the third light to the first light. For example, the first quantum dot QD1 included in the first light-controlling part CCP1 may be a red quantum dot.

The second light-controlling part CCP2 may transmit the second light. The second light-controlling part CCP2 may include the scattering body SP dispersed in the second base resin BR2, and may not include a light-converting body.

The third light-controlling part CCP3 may transmit the third light. The third light-controlling part CCP3 may include the scattering body SP dispersed in the third base resin BR3, and may not include a light-converting body.

An embodiment of the light-controlling layer CCL is not limited thereto, and the second light-controlling part CCP2 and/or the third light-controlling part CCP3 may include a quantum dot.

The upper display substrate 200 may include a second filling layer BFL2. The second filling layer BFL2 may be disposed between the light-controlling parts CCP1, CCP2, and CCP3, and the color filter layer CFL. In some embodiments, the second filling layer BFL2 may be between the light-controlling layer CCL and color filters CF1, CF2, and CF3 of the color filter layer CFL. The second filling layer BFL2 may function to prevent or block permeation of moisture and/or oxygen (hereinafter, called "moisture/oxygen").

In some embodiments, a barrier layer disposed under the light-controlling parts CCP1, CCP2, and CCP3 may be further provided. The barrier layer may cover the light-controlling parts CCP1, CCP2, and CCP3, and may prevent or block the light-controlling part CCP1, CCP2, and CCP3 from being exposed to moisture/oxygen.

The color filter layer CFL may be disposed on the light-controlling layer CCL. For example, the color filter layer CFL may be disposed directly on the light-controlling layer CCL. In this case, the second filling layer BFL2 may be omitted.

The color filter layer CFL may include a shading part BM, and color filters CF1, CF2, and CF3. For example, the color filter layer CFL may include a first color filter CF1 that transmits first light, a second color filter CF2 that transmits second light, and a third color filter CF3 that transmits third light. For example, the first color filter CF1 may be a red color filter, the second color filter CF2 may be a green color filter, and the third color filter CF3 may be a blue color filter.

Each of the first to third color filters CF1, CF2, and CF3 may include (e.g., be) a photosensitive polymer resin, a pigment, and/or dye. The first color filter CF1 may include (e.g., be) a red pigment and/or dye, the second color filter CF2 may include (e.g., be) a green pigment and/or dye, and the third color filter CF3 may include (e.g., be) a blue pigment and/or dye. Meanwhile, an embodiment is not limited thereto. For example, in some embodiments, the third color filter CF3 may not include a pigment or a dye. In some embodiments, the third color filter CF3 may include (e.g., be) a photosensitive polymer resin, and may not include a pigment or a dye.

The shading part BM may be a black matrix. The shading part BM may include (e.g., be) an organic shading material and/or an inorganic shading material, which includes (e.g., is) a black pigment and/or a black dye. The shading part BM may prevent or reduce a light leakage phenomenon, and may distinguish the boundaries between adjacent color filters CF1, CF2, and CF3. In addition, the shading part BM according to an embodiment may be formed of a blue filter (e.g., blue color filter).

The first to third color filters CF1, CF2, and CF3 may be disposed respectively corresponding to the first pixel region PXA-R, the second pixel region PXA-G, and the third pixel region PXA-B. For example, the first color filter CF1, the second color filter CF2, and the third color filter CF3 may respectively overlap the first pixel region PXA-R, the second pixel region PXA-G, and the third pixel region PXA-B.

The base substrate BL may provide a base surface on which the color filter layer CFL, the light-controlling layer CCL, and/or the like are disposed. The base substrate BL may be a glass substrate, a metal substrate, a plastic substrate, and/or the like. However, an embodiment is not limited thereto, and the base substrate BL may be an inorganic layer, an organic layer, and/or a composite material layer. In some embodiments, the base substrate BL may be omitted. In the case that the base substrate BL is omitted, the light-controlling layer CCL and the color filter layer CFL are sequentially stacked on the lower display substrate 100, for example, on the first filling layer BFL1.

Meanwhile, the configuration of the upper display substrate 200 is not limited thereto. For example, the upper display substrate 200 may further include a polarizing layer, and/or may exclude the color filter layer CFL. The polarizing layer may block external light incident on the display panel DP from the outside.

FIG. 5 is a cross-sectional view schematically illustrating a light-emitting element ED according to an embodiment. The first to third light-emitting elements ED1, ED2, and ED3 according to an embodiment may each have a structure of a light-emitting element ED as illustrated.

Referring to FIG. 5, the light-emitting element ED may include the first electrode EL1, the second electrode EL2, n number of stack layers SF1 to SFn disposed between the first electrode EL1 and the second electrode EL2, and n may be an integer of at least two. In some embodiments, the light-emitting element ED may include at least two stack layers, for example, two stack layers, three stack layers, or at least four stack layers.

Each of a plurality of stack layers SF1 to SFn may include a hole-transport region HTR, an emission layer EML, and an electron-transport region ETR. A charge generation layer CGL may be disposed between adjacent stacks among the plurality of stack layers SF1 to SFn. The charge generation layer CGL may include a p-type charge generation layer and/or an n-type charge generation layer. The charge generation layer CGL may promote movement of holes and/or electrons.

The first electrode EL1 has a conductive property. The first electrode EL1 may be formed of a metal material, a metal alloy, and/or a conductive compound. The first electrode EL1 may be an anode or a cathode. However, an embodiment is not limited thereto. In addition, the first electrode EL1 may be a pixel electrode. The first electrode EL1 may be a transmissive electrode, a transflective electrode, or a reflective electrode. If the first electrode EL1 is a transmissive electrode, the first electrode EL1 may include (e.g., be) a transparent metal oxide such as indium tin oxide (ITO), indium zinc oxide (IZO), zinc oxide (ZnO), and/or indium tin zinc oxide (ITZO). If the first electrode EL1 is a transflective electrode or a reflective electrode, the first electrode EL1 may include (e.g., be) silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), tungsten (W), a compound thereof, or a mixture thereof (for example, a mixture of Ag and Mg). In some embodiments, the first electrode EL1 may have a multilayer structure including a reflective film or a transflective film, which is formed of the above material, and a transparent conductive film, which is formed of ITO, IZO, ZnO, ITZO, and/or the like. For example, the first electrode EL1 may have a three-layer structure of ITO/Ag/ITO, but is not limited thereto. Furthermore, an embodiment is not limited thereto, and the first electrode EL1 may include (e.g., be) the above-described metal material, a combination of at least two metal materials selected from the above-described metal materials, and/or oxides of the above-described metal materials. The thickness of the first electrode EL1 may be about 700 Å to about 10,000 Å. For example, the thickness of the first electrode EL1 may be about 1,000 Å to about 3,000 Å.

The hole-transport region HTR is provided on the first electrode EL1. The hole-transport region HTR may include at least one of a hole-transport layer HTL or an electron-blocking layer EBL. However, an embodiment is not limited thereto, and the hole-transport region HTR may further include a hole-injecting layer, a buffer layer, and/or a light-emitting auxiliary layer. In some embodiments, the thickness of the hole-transport region HTR may be about 50 Å to about 15,000 Å.

The hole-transport region HTR may have a single layer composed of a single material, a single layer composed of a plurality of different materials, or a multilayer structure having a plurality of layers composed of a plurality of different materials.

For example, the hole-transport region HTR may have a single layer structure of a hole-injecting layer or a hole-transport layer, or may have a single layer structure composed of a hole-injecting material and a hole-transport material. In addition, the hole-transport region HTR may have a single layer structure composed of a plurality of different materials, or may have a structure having a hole-injecting layer/a hole-transport layer (e.g., a hole-injecting layer and a hole-transport layer), a hole-injecting layer/a hole-transport layer/a buffer layer (e.g., a hole-injecting layer, a hole-transport layer, and a buffer layer), a hole-injecting layer/a buffer layer (e.g., a hole-injecting layer and a buffer layer), a hole-transport layer/a buffer layer (e.g., a hole-transport layer and a buffer layer), or a hole-injecting layer/a hole-transport layer/an electron-blocking layer (e.g., a hole-injecting layer, a hole-transport layer, and an electron-blocking layer) sequentially stacked from the first electrode EL1, but an embodiment is not limited thereto.

The hole-transport region HTR may be formed by utilizing (e.g., using) various suitable methods such as a vacuum deposition method, a spin-coating method, a cast method, a Langmuir-Blodgett (LB) method, an inkjet-printing method, a laser-printing method, and/or a laser-induced thermal imaging (LITI) method.

As described above, the hole-transport region HTR may further include at least one of a buffer layer or an electron-blocking layer in addition to a hole-injecting layer and/or a hole-transport layer. The buffer layer may increase light emission efficiency by compensating for the resonance distance according to the wavelength of light emitted from the emission layer EML. A material included in the hole-transport region HTR may be utilized (e.g., used) as a material that may be included in the buffer layer. The electron-blocking layer plays a role in preventing or blocking electrons form being injected from the electron-transport region ETR to the hole-transport region HTR.

The emission layer EML is provided on the hole-transport region HTR. For example, the emission layer EML may have a thickness of about 100 Å to about 1,000 Å, for example, about 100 Å to about 300 Å. The emission layer EML may have a single layer composed of a single material, a single layer composed of a plurality of different materials, or a multilayer structure having a plurality of layers composed of a plurality of different materials.

The emission layer EML may include (e.g., be) a low-molecular organic material and/or a high-molecular organic material as a light-emitting material. The emission layer EML may include (e.g., be) a host material and a dopant material. The emission layer EML may be formed by utilizing (e.g., using), in a host material, a phosphorescent and/or fluorescent light-emitting material as a dopant. The emission layer EML may include a thermally activated delayed fluorescence (TADF) dopant in a host material.

The emission layer EML may include an anthracene derivative, a pyrene derivative, a fluoranthene derivative, a chrysene derivative, a dihydrobenzanthracene derivative, and/or a triphenylene derivative. For example, the emission layer EML may include an anthracene derivative and/or a pyrene derivative.

In addition, the emission layer EML may include a styryl derivative (for example, 1,4-bis[2-(3-N-ethylcarbazoryl)vinyl]benzene(BCzVB), 4-(di-p-tolylamino)-4'-[(di-p-tolylamino)styryl]stilbene(DPAVB), N-(4-((E)-2-(6-((E)-4-(diphenylamino)styryl)naphthalen-2-yl)vinyl)phenyl)-N-phenylbenzenamine(N-BDAVBi)), perylene and a derivative thereof (for example, 2, 5, 8, 11-Tetra-t-butylperylene(TBP)), pyrene and a derivative thereof (for example, 1,1-dipyrene, 1,4-dipyrenylbenzene, 1,4-bis(N, N-Diphenylamino)pyrene), N1,N6-di(naphthalen-2-yl)-N1,N6-diphenylpyrene-1,6-diamine), etc. However, an embodiment is not limited thereto, and may include a known or generally available substance.

The plurality of stack layers SF1 to SFn may include emission layers EML to emit different light. For example, a emission layer EML included in the first layer stack SF1 and a emission layer EML included in the n-th layer stack SFn may emit different light. However, an embodiment is not limited thereto, and all of the emission layers EML included in the plurality of stack layers SF1 to SFn may emit the same light, or the emission layers EML included in some (e.g., two or more, but less than all) of the stack layers SF1 to SFn may emit the same light. For example, when n is three, two of the stack layers SF1 to SF3 may emit one color of light, and the remaining third stack layer of the stack layers SF1 to SF3 may emit another color of light different from the one color of light.

The electron-transport region ETR may be disposed on the emission layer EML. The electron-transport region ETR may include at least one of an electron-transport layer ETL or a hole-blocking layer HBL. However, an embodiment is not limited thereto, and the electron-transport region ETR may further include an electron-injecting layer, a buffer layer, and/or a light-emitting auxiliary layer.

The electron-transport region ETR may have a single layer composed of a single material, a single layer composed of a plurality of different materials, or a multilayer structure having a plurality of layers composed of a plurality of different materials.

For example, the electron-transport region ETR may have a single layer structure of an electron-injecting layer or an electron-transport layer ETL, or may have a single layer structure composed of an electron-injecting material and an electron-transport material. In addition, the electron-transport region ETR may have a single layer structure composed of a plurality of different materials, or may have a structure having an electron-transport layer/an electron-injecting layer (e.g., an electron-transport layer ETL and an electron-injecting layer) or a hole-blocking layer/an electron-transport layer/an electron-injecting layer (e.g., a hole-blocking layer HBL, an electron-transport layer ETL, and an electron-injecting layer) which are sequentially stacked from the emission layer EML, but an embodiment is not limited thereto.

The electron-transport region ETR may be formed by utilizing (e.g., using) various suitable methods such as a vacuum deposition method, a spin-coating method, a cast method, a Langmuir-Blodgett (LB) method, an inkjet-printing method, a laser-printing method, and/or a laser-induced thermal imaging (LITI) method.

The light-emitting element ED according to an embodiment may include an electron-injecting layer EIL under the second electrode EL2 (e.g., between the second electrode EL2 and the n-th stack layers SFn). However, an embodiment is not limited thereto, and an electron-injecting layer may be disposed in the electron-transport area ETR included in each of a plurality of stack layers SF1 to SFn.

The electron-injecting layer EIL may include (e.g., be) a lanthanide metal such as Yb. However, an embodiment is not limited thereto, and a metal halide such as LiF, NaCl, CsF, RbCl, and/or RbI, a metal oxide such as $Li_2O$ and/or BaO, and/or lithium quinolate (Liq), etc. may be utilized (e.g., used) as an electron-injecting layer EIL. Also, the electron-injecting layer EIL may be composed of a mixture of an electron-transport material and an insulating organo metal salt. The organo metal salt may have an energy band gap of at least about 4 eV. For example, the organo metal salt may include (e.g., be) metal acetate, metal benzoate, metal acetoacetate, metal acetylacetonate, and/or metal stearate.

The second electrode EL2 may be a common electrode. The second electrode EL2 may be a cathode or an anode, but an embodiment is not limited thereto. For example, when the first electrode EL1 is an anode, the second electrode EL2 may be a cathode; and when the first electrode EL1 is a cathode, the second electrode EL2 is an anode.

The second electrode EL2 may be a transmissive electrode, a transflective electrode, or a reflective electrode. When the second electrode EL2 is a transmissive electrode, the second electrode EL2 may be composed of a transmissive metal oxide such as indium tin oxide (ITO), indium zinc oxide (IZO), zinc oxide (ZnO), and/or indium tin zinc oxide (ITZO).

When the second electrode EL2 is a transflective electrode or a reflective electrode, the second electrode EL2 may include (e.g., be) Ag, Mg, Cu, Al, Pt, Pd, Au, Ni, Nd, Ir, Cr, Li, Ca, LiF/Ca, LiF/Al, Mo, Ti, Yb, W, or a compound (or a mixture) which includes (e.g., is) one or more of the above materials (for example, AgMg, AgYb, and/or MgAg). In some embodiments, the second electrode EL2 may have a multilayer structure including a reflective film or a transflective film which is formed of one or more of the above materials, and a transparent conductive film which is formed of ITO, IZO, ZnO, ITZO, and/or the like. For example, the second electrode EL2 may include (e.g., be) the above-described metal material, a combination of at least two metal materials selected from the above-described metal materials, and/or oxides of the above-described metal materials.

In some embodiments, the second electrode EL2 may be coupled (e.g., connected) with an auxiliary electrode. When the second electrode EL2 is coupled (e.g., connected), the resistance of the second electrode EL2 may decrease.

Figure 6:
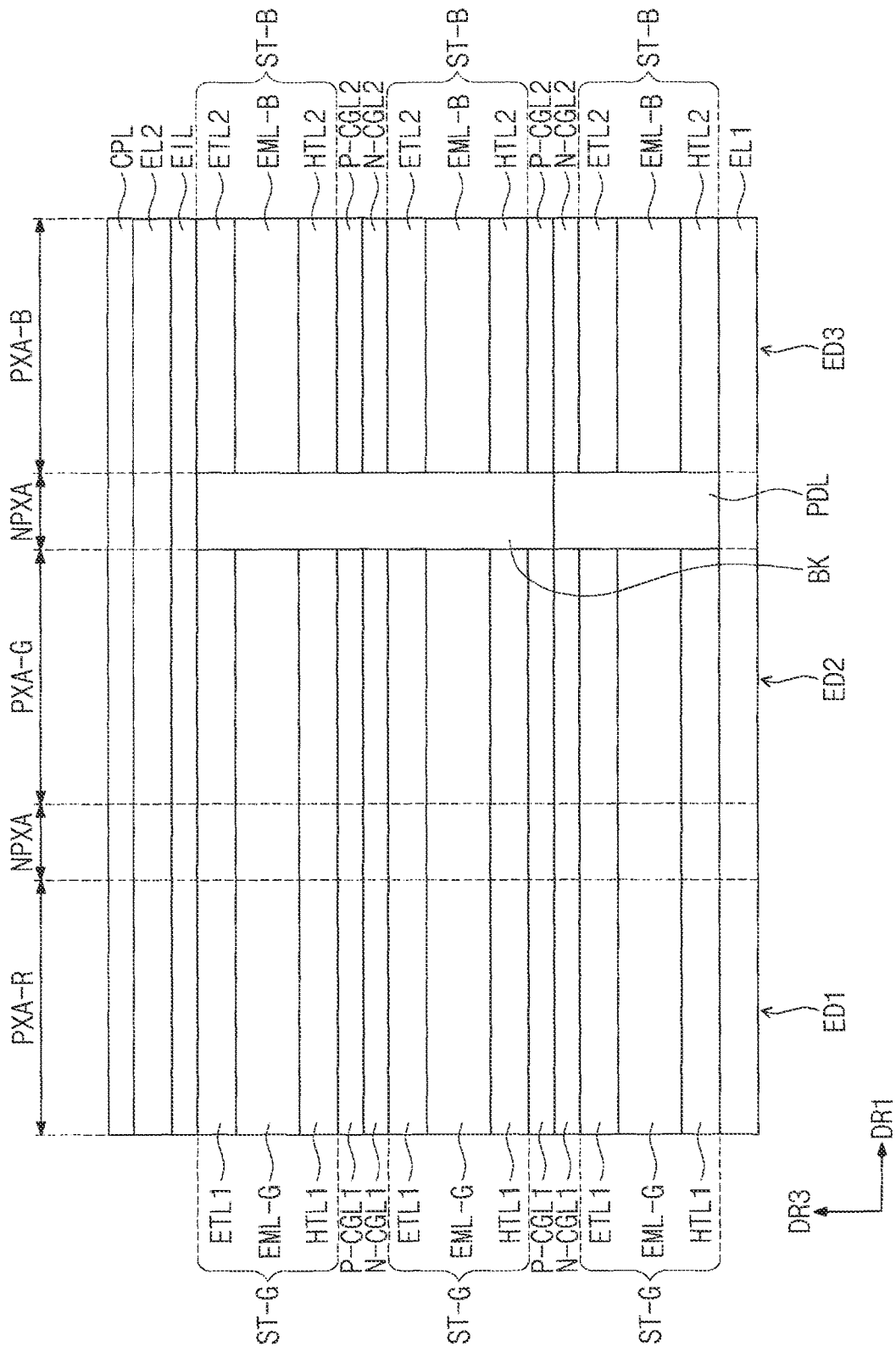
FIG. 6 is a cross-sectional view of light-emitting elements according to an embodiment.

FIG. 6 is a cross-sectional view schematically illustrating light-emitting elements ED1, ED2, and ED3 according to an embodiment. For example, FIG. 6 illustrates the structures of the light-emitting elements ED1, ED2, and ED3 of FIG. 4.

Referring to FIG. 6, it is illustrated that each of the first to third light-emitting elements ED1, ED2, and ED3 includes three stack layers. For example, it is illustrated that each of the first to third light-emitting elements ED1, ED2, and ED3 includes three stack layers corresponding to the first layer to third layer stack SF1, SF2, and SF3 already described in FIG. 4. However, an embodiment is not limited thereto, and, for example, each of the first to third light-emitting elements ED1, ED2, and ED3, may include two stack layers, or at least four stack layers.

Each of the first light-emitting element ED1 and the second light-emitting element ED2 according to an embodiment may include a first stack part ST-G as the first layer stack SF1, may include the first stack part ST-G as the second layer stack SF2, and may include the first stack part ST-G as the third layer stack SF3, described already with reference to FIG. 4. In some embodiments, a plurality of stack layers included in the first light-emitting element ED1 and the second light-emitting element ED2 may all include the first stack part ST-G.

Accordingly, the first stack part ST-G of the first layer stack SF1 included in each of the first light-emitting element ED1 and the second light-emitting element ED2 may have an integrated shape (e.g., may be integrated together as a single continuous first stack part ST-G that corresponds to each of the first and second light-emitting elements ED1 and ED2), the first stack part ST-G of the second layer stack SF2 (e.g., the first stack part ST-G of the second layer stack SF2 in each of the first light-emitting element ED1 and the second light-emitting element ED2) may have an integrated shape, and the first stack part ST-G of the third layer stack SF3 (e.g., the first stack part ST-G of the third layer stack SF3 in each of the first light-emitting element ED1 and the second light-emitting element ED2) may have an integrated shape. However, an embodiment is not limited thereto.

The third light-emitting element ED3 according to an embodiment may have a structure different from those of the first light-emitting element ED1 and the second light-emitting element ED2. For example, the third light-emitting element ED3 may include three second stack parts ST-B. For example, the first to third layer stacks SF1, SF2, and SF3 of the third light-emitting element ED3 may be all the second stack part ST-B. In some embodiments, the first to third layer stacks SF1, SF2, and SF3 of the third light-emitting element ED3 are spaced apart in a plan view from (e.g., separated from) the first to third layer stacks SF1, SF2, and SF3 of the first and second light-emitting elements ED1 and ED2, for example, by the bank BK and/or by the pixel-defining film PDL.

The first stack part ST-G may emit the second light, and the second stack part ST-B may emit the third light. For example, the first stack part ST-G may emit green light, and the second stack part ST-B may emit blue light.

The second stack part ST-B, of each layer, included in the third light-emitting element ED3 may not have a shape integrated with the first stack part ST-G included in each layer (e.g., each corresponding layer) of the first light-emitting element ED1 and the second light-emitting element ED2. In some embodiments, the second stack part ST-B of the third light-emitting element ED3 may be spaced apart from the first stack part ST-G of the first light-emitting element ED1 and the second light-emitting element ED2 by a bank BK. Meanwhile, because the bank BK is disposed on the boundary of the third light-emitting element ED3, the hole-transport region HTR, the emission layer EML, the electron-transport region ETR, etc., included in the second stack part ST-B of each stack layer of the third light-emitting element ED3 may be provided by being patterned with an inkjet-printing method.

Meanwhile, FIG. 6 illustrates that a pixel-defining film PDL and the bank BK have separate shapes. However, an embodiment is not limited thereto, and the pixel-defining film PDL and the bank BK may have an integrated shape. For example, the pixel-defining film PDL and the bank BK may be an integral body (e.g., a single, continuous body). For example, the pixel-defining film PDL and the bank BK may include (e.g., be) the same material.

Each of the first stack part ST-G and the second stack part ST-B may include a hole-transport region, an emission layer, and an electron-transport area. FIG. 6 illustrates that the electron-transport region ETR includes the electron-transport layers ETL1 and ETL2, and the hole-transport region HTR includes the hole-transport layers HTL1 and HTL2.

For example, the first stack part ST-G may include a first hole-transport layer HTL1, a first emission layer EML-G, and a first electron-transport layer ETL1. The first emission layer EML-G may emit the second light.

For example, the second stack part ST-B may include a second hole-transport layer HTL2, a second emission layer EML-B, and a second electron-transport layer ETL2. The second emission layer EML-B may emit the third light.

However, an embodiment is not limited thereto, and each of the first stack part ST-G and the second stack part ST-B may further include an electron-injecting layer, a hole-blocking layer, a hole-injecting layer, an electron-blocking layer, a buffer layer, etc.

The first light-emitting element ED1 may include only the first stack part ST-G (e.g., may only include the first stack part ST-G for each of the stack layers SF1 to SFn of the first light-emitting element ED1) and may emit the second light. Referring to FIG. 4, the first light-controlling part CCP1 overlapping the first light-emitting element ED1 may include the first quantum dot QD1 and convert the second light to the first light.

The second light-emitting element ED2 may include only the first stack part ST-G (e.g., may only include the first stack part ST-G for each of the stack layers SF1 to SFn of the second light-emitting element ED2) and may emit the second light. Referring FIG. 4, the second light-controlling part CCP2 overlapping the second light-emitting element ED2 may transmit the second light without including a light-converting body.

The third light-emitting element ED3 may include only the second stack part ST-B (e.g., may only include the second stack part ST-B for each of the stack layers SF1 to SFn of the third light-emitting element ED3) and may emit the third light. Referring to FIG. 4, the third light-controlling part CCP3 overlapping the third light-emitting element ED3 may transmit the third light without including a light-converting body.

A charge generation layer may be disposed between the stack parts ST-G and ST-B, for example, between adjacent ones of the first stack parts ST-G and between adjacent ones of the second stack parts ST-B. The charge generation layer may include p-type charge generation layers P-CGL1 and P-CGL2, and n-type charge generation layers N-CGL1 and N-CGL2, and may promote movement of holes and/or electrons between the stack parts ST-G, and ST-B. Each of the charge generation layers P-CGL1, P-CGL2, N-CGL1, and N-CGL2 may be disposed in contact with at least one selected from the stack parts ST-G and ST-B.

In an embodiment, first charge generation layers N-CGL1 and P-CGL1 may be disposed by being stacked between the first stack parts ST-G. Second charge generation layers N-CGL2 and P-CGL2 may be disposed by being stacked between the second stack parts ST-B.

For example, an n-type first charge generation layer N-CGL1 to provide electrons to the first stack part ST-G of the first layer stack SF1 (e.g., the first layer stack SF1 of the first and second light-emitting elements ED1 and ED2) may be disposed on the first stack part ST-G of the first layer stack SF1. A p-type first charge generation layer P-CGL1 to provide holes to the first stack part ST-G of the second layer stack SF2 (e.g., the second layer stack SF2 of the first and second light-emitting elements ED1 and ED2) may be disposed under the first stack part ST-G of the second stack SF2. An n-type second charge generation layer N-CGL2 to provide electrons to the second stack part ST-B of the first layer stack SF1 (e.g., the first layer stack SF1 of the third light-emitting element ED3) may be disposed on the second stack part ST-B of the first layer stack SF1. A p-type second charge generation layer P-CGL2 to provide holes to the second stack part ST-B of the second layer stack SF2 (e.g., the second layer stack SF2 of the third light-emitting element ED3) may be disposed under the second stack part ST-B of the second stack SF2.

Meanwhile, in the case that sequentially stacked stack layers include different stack parts, n-type charge generation layers and p-type charge generation layers are determined according to the type (e.g., kind) of a directly contacting stack part. For example, referring to FIG. 8, an n-type first charge generation layer N-CGL1 may be disposed on the first stack part ST-G of the second layer stack SF2 (e.g., the second layer stack SF2 of the first and second light-emitting elements ED1 and ED2), and a p-type second charge generation layer P-CGL2 may be disposed under the second stack part ST-B of the third layer stack SF3 (e.g., the third layer stack SF3 of the first and second light-emitting elements ED1 and ED2).

The p-type first charge generation layer P-CGL1 and the n-type first charge generation layer N-CGL1, and the p-type second charge generation layer P-CGL2 and the n-type second charge generation layer N-CGL2 may include (e.g., be) different materials. Charge generation characteristics may be controlled by varying materials for the charge generation layer. However, an embodiment is not limited thereto.

In an embodiment, the p-type second charge generation layer P-CGL2 may have higher charge generation characteristics than the p-type first charge generation layer P-CGL1. For example, a material included in (e.g., constituting) the p-type second charge generation layer P-CGL2 may have higher charge generation characteristics than a material included in (e.g., constituting) the p-type first charge generation layer P-CGL1.

The p-type first charge generation layer P-CGL1 may include an organic dopant. For example, the organic dopant may be a p-type dopant (e.g., a p-dopant). For example, the p-type dopant may include (e.g., be) at least one selected from 4-[[2,3-bis[cyano-(4-cyano-2,3,5,6-tetrafluorophenyl) methylidene]cyclopropylidene]-cyanomethyl]-2,3,5,6-tetrafluorobenzonitrile (NDP9), 1,4,5,8,9,11-hexaazatriphenylene-hexacarbonitrile (HAT-CN), 2,3,5,6-tetrafluoro-7,7,8,8-tetracyanoquinodimethane (F4-TCNQ), and tetracyanoquinodimethane (TCNQ). In an embodiment, the doping concentration of the organic dopant included in the p-type first charge generation layer P-CGL1 may be about 0.5% to about 30%.

The p-type second charge generation layer P-CGL2 may include an inorganic dopant. For example, the inorganic dopant may include (e.g., be) a post-transition metal such as Al, gallium (Ga), indium (In), Tl, tin (Sn), lead (Pb), flerovium (Fl), bismuth (Bi), and/or polonium (Po); a metalloid such as boron (B), Si, Ge, arsenic (As), antimony (Sb), tellurium (Te), and/or astatine (At); a compound thereof such as $Bi_2Te_3$, $Bi_xTe_y$, $Sb_2Te_3$, $In_2Te_3$, $Ga_2Te_2$, $Al_2Te_3$, $Tl_2Te_3$, $As_2Te_3$, GeSbTe, SnTe, PbTe, SiTe, GeTe, FlTe, SiGe, AlInSb, AlGaSb, AlAsSb, GaAs, InSb, AlSb, AlAs, $Al_xIn_xSb$, $Al_xIn_{(1-x)}Sb$, AlSb, GaSb, and/or AlInGaAs; and/or a compound of a transition metal and a halogen such as CuI, AgI, AuI, $CoI_2$, $NiI_2$, $PtI_2$, CuCl, CuBr, AgCl, and/or AgBr. In an embodiment, the doping concentration of the inorganic dopant included in the p-type second charge generation layer P-CGL2 may be about 0.5% to about 30%.

FIG. 6 illustrates that an electron-injecting layer EIL overlaps the first to third pixel regions PXA-R, PXA-G, and PXA-B, and has an integrated shape. However, an embodiment is not limited thereto. For example, according to an embodiment, a material for the electron-injecting layer EIL and/or a concentration of the material included therein may vary in each pixel area.

In an embodiment, a capping layer CPL may be further disposed on the first to third light-emitting elements ED1, ED2, and ED3. The capping layer CPL may include a single layer or a multilayer. In an embodiment, the capping layer CPL may be an organic or inorganic layer. For example, when the capping layer CPL includes (e.g., is) an inorganic material, the inorganic material may include (e.g., be) an alkali metal compound (such as LiF), an alkaline earth metal compound (such as $MgF_2$), SiON, $SiN_x$, $SiO_y$, and/or the like.

For example, when the capping layer CPL includes (e.g., is) an organic material, the organic material may include (e.g., be) α-NPD, NPB, TPD, m-MTDATA, $Alq_3$, CuPc, TPD15 (N4,N4,N4',N4'-tetra (biphenyl-4-yl) biphenyl-4,4'-diamine), TCTA (4,4',4''-tris(carbazol sol-9-yl) triphenylamine), and/or the like. In some embodiments, the organic material may include (e.g., be) an epoxy-based resin and/or an acrylate, such as methacrylate.

However, an embodiment is not limited thereto. In some embodiments, and the capping layer CPL may be omitted.

Figure 7:
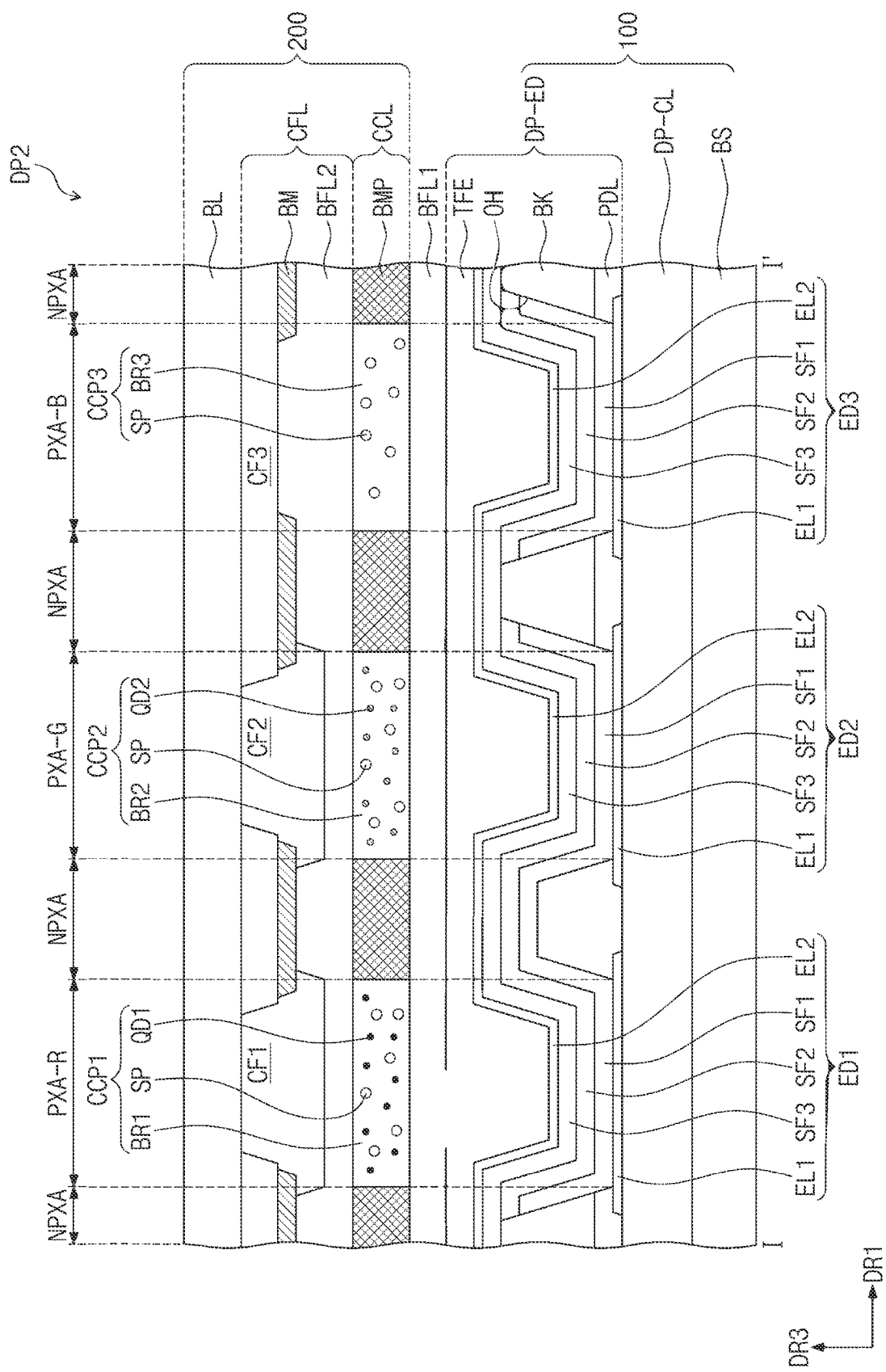
FIG. 7 is a cross-sectional view of a display panel according to an embodiment.
Figure 8:
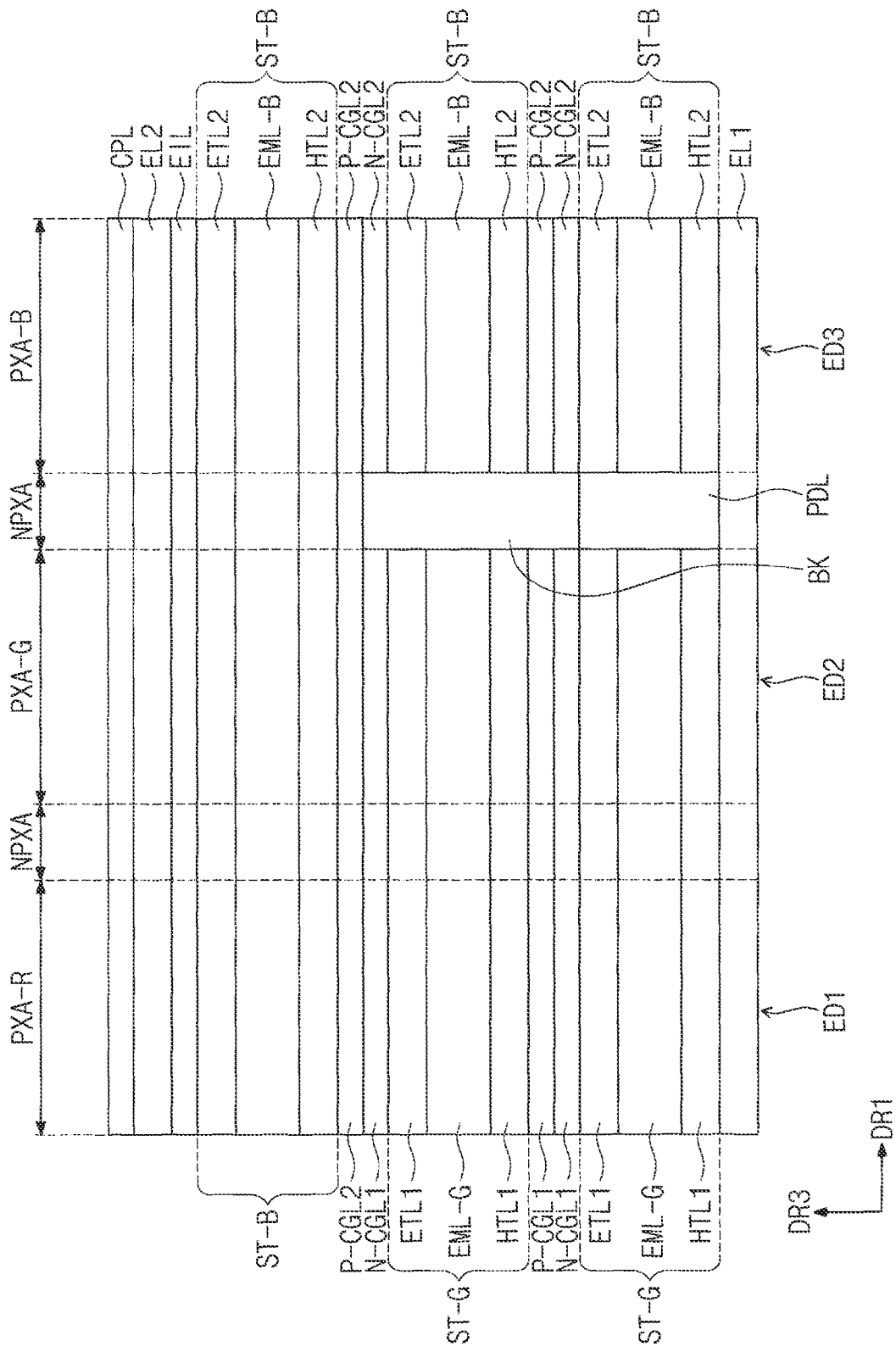
FIG. 8 is a cross-sectional view of light-emitting elements according to an embodiment.

FIG. 7 is a cross-sectional view of a display panel DP according to another embodiment. FIG. 8 is a cross-sectional view of light-emitting elements ED1, ED2, and ED3 according of an embodiment. Hereinafter, in FIGS. 7 and 8, like reference numerals are given to like elements, and thus redundant descriptions thereof may not be provided, and differences will be mainly described.

In an embodiment, the first light-emitting element ED1 may include the first stack part ST-G as the first layer stack SF1, may include the first stack part ST-G as the second layer stack SF2, and may include the second stack part ST-B as the third layer stack SF3, as described before with reference to FIG. 4. For example, the first light-emitting element ED1 may include two first stack parts ST-G, and one second stack part ST-B. However, the stacking sequence of the first stack parts ST-G and the second stack part ST-B is not limited thereto. For example, the second stack part ST-B may be the first layer stack SF1 or the second layer stack SF2. In addition, the configuration of the first light-emitting element ED1 is not limited thereto. For example, the first light-emitting element ED1 may include four stack parts, and as another example, the first light-emitting element ED1 may include three second stack parts ST-B and one first stack part ST-G.

The second light-emitting element ED2 of an embodiment may have the same structure as the first light-emitting element ED1. For example, the second light-emitting element ED2 may include the first stack part ST-G as the first layer stack SF1, may include the first stack part ST-G as the second layer stack SF2, and may include the second stack part ST-B as the third layer stack SF3, as described already with reference to FIG. 4. However, the stacking sequence and the structure are not limited thereto, and various suitable stacking sequences and structures as in the first light-emitting element ED1 may be employed.

The third light-emitting element ED3 according to an embodiment may have a structure different from those of the first light-emitting element ED1 and the second light-emitting element ED2. For example, the third light-emitting element ED3 may include three second stack parts ST-B. For example, in the third light-emitting element ED3, each of the first to third layer stacks SF1, SF2, and SF3 may be the second stack part ST-B.

In the light-emitting elements ED1, ED2, and ED3 according to an embodiment illustrated in FIGS. 7 to 8, as all of the third layer stacks SF3 of the first to third light-emitting elements ED1, ED2, and ED3 are the second stack part ST-B, the third layer stack SF3 of the first to third light-emitting elements ED1, ED2, and ED3 may have an integrated shape. When some stack layers are configured in an integrated shape, the process may be simplified.

Meanwhile, the bank BK disposed on the pixel-defining film PDL may overlap the first layer stack SF1 and the second layer stack SF2 of the third light-emitting element ED3 in the first direction DR1, and may not overlap the third layer stack SF3. For example, the bank BK may not be disposed between the third stacks having an integrated shape. In some embodiments, the pixel defining layer PDL and the bank BK may be between (e.g., space apart and/or separate) the first and second layer stacks SF1 and SF2 of the third light-emitting element ED3 and the first and second layer stacks SF1 and SF2 of the first and second light emitting elements ED1 and ED2 in the plan view. However, an embodiment is not limited thereto.

The first light-emitting element ED1 may include both the first stack part ST-G and the second stack part ST-B and may emit the second light and the third light. Referring to FIG. 7, the first light-controlling part CCP1 overlapping the first light-emitting element ED1 may include the first quantum dot QD1 and may convert the second light and the third light to the first light.

The second light-emitting element ED2 may include both the first stack part ST-G and the second stack part ST-B and may emit the second light and the third light. Referring to FIG. 7, the second light-controlling part CCP2 overlapping the second light-emitting element ED2 may transmit the second light. In addition, the second light-controlling part CCP2 may include the second quantum dot QD2 and may convert the third light to the second light. For example, the second quantum dot QD2 included in the second light-controlling part CCP2 may be a green quantum dot that converts the third light to the second light.

Because the first light-emitting element ED1 and the second light-emitting element ED2 of the display panel DP of the present disclosure include the first stack part ST-G including the first emission layer EML-G, the light-emitting efficiency of the display panel DP may be improved.

For example, the emission layer of the display panel of the present disclosure may emit both green light and blue light, thereby improving the light conversion rate in the light-controlling layer CCL. Accordingly, the display panel of the present disclosure may increase the amount of light having a center wavelength of about 500 nm to about 550 nm by at least about 60%, compared to the display panel of which a emission layer emits only blue light.

Hereinafter, results obtained by evaluating the characteristics of the display panel of the present disclosure will be described with reference to specific examples. However, the present disclosure is not limited to the following examples.
(Production and Evaluation of Display Panel)

As shown in Table 1, display panels of Examples 1 to 5 and Comparative Example 1 including first to third light-emitting elements as in FIG. 6 were produced in such a way that all features were the same except that only an inorganic material and a doping concentration of a p-type second charge generation layer P-CGL2 were varied.

TABLE 1

| Division | p-Type second charge generation layer P-CGL2 | | p-Type first charge generation layer P-CGL1 | |
|---|---|---|---|---|
| | Doping material | Doping concentration (%) | Doping material | Doping concentration (%) |
| Example 1 | $Bi_2Te_3$ | 5 | NDP9 | 10 |
| | CuI | 10 | | |
| Example 2 | $Bi_2Te_3$ | 10 | NDP9 | 10 |
| | CuI | 10 | | |
| Example 3 | $Bi_2Te_3$ | 15 | NDP9 | 10 |
| | CuI | 10 | | |
| Example 4 | $Bi_2Te_3$ | 10 | NDP9 | 10 |
| | CuI | 5 | | |
| Example 5 | $Bi_2Te_3$ | 10 | NDP9 | 10 |
| | CuI | 15 | | |
| Comparative Example 1 | NDP9 | 10 | NDP9 | 10 |

Referring to Table 1, in each of Examples 1 to 5, an inorganic material was doped, and a p-type second charge generation layer was formed. In Comparative Example 1, the same organic material as a p-type first charge generation layer was doped, and a p-type second charge generation layer was formed.

In Table 2, driving voltages of the display panels produced in Table 1 were measured and shown. The driving voltages shown in Table 2 represent the voltage values measured on the basis of a current density of 10 mA/cm².

TABLE 2

| Division | Driving voltage (V) | Efficiency (cd/A) | Relative lifetime (%) |
|---|---|---|---|
| Example 1 | 10.9 | 22.9 | 105 |
| Example 2 | 10.4 | 23.0 | 121 |
| Example 3 | 10.3 | 23.7 | 116 |
| Example 4 | 10.6 | 22.7 | 108 |
| Example 5 | 10.4 | 23.6 | 117 |
| Comparative Example 1 | 11.4 | 21.6 | 100 |

Referring to Table 2, it may be seen that the light-emitting elements of Examples 1 to 5 achieve low voltage characteristics, high efficiency, and long lifetime (lifespan), compared to Comparative Examples.

Consequently, it may be confirmed that the display panel according to an embodiment of the present disclosure adjusts the charge generation characteristics of the p-type charge generation layer according to the emission layer, and for example, adjusts the charge generation characteristics of the p-type second charge generation layer to be higher than the charge generation characteristics of the p-type first charge generation layer, so that the driving voltage during driving of the element may be lowered, thereby improving efficiency and lifetime.

The display panel of the present disclosure includes the first stack part ST-G and the second stack part ST-B, which emit different color light, and the p-type second charge generation layer disposed between the second stack parts ST-B and to emit blue light has a higher degree of charge generation than the p-type first charge generation layer disposed between the first stack parts ST-G and to emit green light, so that the efficiency and lifetime of an element may be improved.

The display panel according to an embodiment of the present disclosure may improve light-emitting efficiency and lifetime.

In the above, description has been made with reference to some embodiments of the present disclosure, but those skilled in the art and/or those of ordinary skill in the relevant technical field may understand that various suitable modifications and changes may be made to the present disclosure within the scope not departing from the spirit and the technology scope of the present disclosure described in the claims to be described later.

Therefore, the technical scope of the present disclosure is not limited to the contents described in the detailed description of the specification, but should be determined by the claims and equivalents thereof.

What is claimed is:

1. A display panel comprising:
   an upper display substrate in which a first pixel region configured to emit first light, a second pixel region configured to emit second light different from the first light, and a third pixel region configured to emit third light different from each of the first light and the second light are defined; and
   a lower display substrate comprising a first light-emitting element overlapping the first pixel region, a second light-emitting element overlapping the second pixel region, and a third light-emitting element overlapping the third pixel region,
   wherein the first light-emitting element and the second light-emitting element each comprises one or more first stack parts and one or more first charge generation layers, each of the one or more first stack parts comprising a first emission layer configured to emit the second light,
   wherein the third light-emitting element comprises one or more second stack parts and one or more second charge generation layers, each of the one or more second stack parts comprising a second emission layer configured to emit the third light,
   wherein the first charge generation layer comprises an organic dopant,
   wherein the second charge generation layer comprises an inorganic dopant, and
   wherein:
      a second charge generation layer of the one or more second charge generation layers comprises a p-type second charge generation layer, the p-type second charge generation layer comprising the inorganic dopant;
      the inorganic dopant comprises at least one selected from a post-transition metal, a metalloid, a compound of a post-transition metal and a metalloid, and a compound of a post-transition metal and a halogen; or the lower display substrate further comprises a bank between the second light-emitting element and the third light-emitting element, and the bank is not between the first light-emitting element and the second light-emitting element.

2. The display panel of claim 1, wherein each of the one or more first charge generation layers comprises a p-type first charge generation layer and an n-type first charge generation layer, each of the one or more second charge generation layers comprises the p-type second charge generation layer and an n-type second charge generation layer, wherein the p-type first charge generation layer comprises the organic dopant, and wherein the p-type second charge generation layer comprises the inorganic dopant.

3. The display panel of claim 1, wherein the organic dopant comprises at least one selected from 4-[[2,3-bis[cyano-(4-cyano-2,3,5,6-tetrafluorophenyl)methylidene]cyclopropylidene]-cyanomethyl]-2,3,5,6-tetrafluorobenzonitrile; 1,4,5,8,9,11-hexaazatriphenylene-hexacarbonitrile; 2,3,5,6-tetrafluoro-7,7,8,8-tetracyanoquinodimethane; and tetracyanoquinodimethane.

4. The display panel of claim 1, wherein the inorganic dopant comprises at least one selected from the post-transition metal, the metalloid, the compound of the post-transition metal and the metalloid, and the compound of the post-transition metal and the halogen.

5. The display panel of claim 1, wherein each of the one or more first stack parts further comprises a first hole transport region under the first emission layer, and a first electron-transport region on the first emission layer, and each of the one or more second stack parts further comprises a second hole-transport region under the second emission layer, and a second electron-transport region on the second emission layer.

6. The display panel of claim 1, wherein the lower display substrate further comprises the bank between the second light-emitting element and the third light-emitting element, and the bank is not between the first light-emitting element and the second light-emitting element.

7. The display panel of claim 6, wherein a non-pixel region adjacent to each of the first to third pixel regions is further defined in the upper display substrate, the lower display substrate further comprises a pixel-defining film overlapping the non-pixel region, and the bank overlaps the pixel-defining film.

8. The display panel of claim 1, wherein each of the one or more first stack parts of the first light-emitting element and each corresponding one of the one or more first stack parts of the second light-emitting element have an integrated shape.

9. The display panel of claim 1, wherein the first light-emitting element and the second light-emitting element each further comprise one or more second stack parts and one or more second charge generation layers, each of the one or more second stack parts of each of the first and second light-emitting elements comprising a second emission layer configured to emit the third light.

10. The display panel of claim 1, wherein the upper display substrate comprises a first light-controlling part overlapping the first pixel region and comprising a first quantum dot, a second light-controlling part overlapping the second pixel region and to transmit the second light, and a third light-controlling part overlapping the third pixel region and to transmit the third light, and the first quantum dot is to convert the second light to the first light.

11. The display panel of claim 9, wherein the upper display substrate further comprises a first light-controlling part overlapping the first pixel region and comprising a first quantum dot, a second light-controlling part overlapping the second pixel region and comprising a second quantum dot, and a third light-controlling part overlapping the third pixel region and to transmit the third light, the first quantum dot is to convert the second light or the third light to the first light, and the second quantum dot is to convert the third light to the second light.

12. The display panel of claim 9, wherein at least one second stack part of the one or more second stack parts of the first light-emitting element and at least one corresponding second stack part of the one or more second stack parts of the second light-emitting element have a shape integrated with at least one corresponding second stack part of the one or more second stack parts of the third light-emitting element.

13. The display panel of claim 1, wherein the third light-emitting element does not comprise a first stack part comprising a first emission layer configured to emit the second light.

14. The display panel of claim 1, wherein the first light-emitting element is the same as the second light-emitting element in structure.

15. The display panel of claim 1, wherein the first light is red light, the second light is green light, and the third light is blue light.

16. A display panel comprising:

an upper display substrate in which a first pixel region, a second pixel region, and a third pixel region are defined and are arranged adjacent in a first direction; and a lower display substrate comprising a first light-emitting element overlapping the first pixel region, a second light-emitting element overlapping the second pixel region, a third light-emitting element overlapping the third pixel region, and a bank between the second light-emitting element and the third light-emitting element, wherein the first light-emitting element and the second light-emitting element each comprise at least one first stack part, each of the at least one first stack part comprising a first emission layer configured to emit a second light, the third light-emitting element comprises at least two second stack parts, each of the at least two second stack parts comprising a second emission layer configured to emit a third light different from the second light, the third light-emitting element does not comprise a first stack part comprising a first emission layer configured to emit the second lights, the lower display substrate further comprises a p-type first charge generation layer under the first emission layer, and a p-type second charge generation layer under the second emission layer, the p-type first charge generation layer comprises an organic dopant, and the p-type second charge generation layer comprises an inorganic dopant.

17. The display panel of claim 16, wherein the lower display substrate further comprises an n-type first charge generation layer on the first emission layer, and an n-type second charge generation layer on the second emission layer.

18. A display panel comprising:
- an upper display substrate in which a first pixel region, a second pixel region, and a third pixel region are defined and are arranged adjacent in a first direction; and
- a lower display substrate comprising a first light-emitting element overlapping the first pixel region, a second light-emitting element overlapping the second pixel region, a third light-emitting element overlapping the third pixel region, and a bank between the second light-emitting element and the third light-emitting element,
- wherein the first light-emitting element and the second light-emitting element each comprise at least one first stack part, each of the at least one first stack part comprising a first emission layer configured to emit a second light,
- the third light-emitting element comprises at least two second stack parts, each of the at least two second stack parts comprising a second emission layer configured to emit a third light different from the second light,
- the third light-emitting element does not comprise a first stack part comprising a first emission layer configured to emit the second light, and
- each of the first to third light-emitting element comprises first-layer to third-layer stacks sequentially stacked in a second direction orthogonal to the first direction.

19. The display panel of claim 18,
- wherein the first-layer to third-layer stacks of each of the first light-emitting element and the second light-emitting element each comprise a first stack part,
- each of the first stack parts of the first-layer to third-layer stacks of the first light-emitting element having an integrated shape with a corresponding one of the first stack parts of the first-layer to third-layer stacks of the second light-emitting element, and
- the first-layer to third-layer stacks of the third light-emitting element each comprise a second stack part.

20. The display panel of claim 18,
- wherein at least one layer selected from the first-layer to third-layer stacks of each of the first light-emitting element and the second light-emitting element comprises a second stack part comprising a second emission layer configured to emit the third light, and the other layers of the first-layer to third-layer stacks of each of the first light-emitting element and the second light-emitting element comprise a corresponding one of the at least one first stack part, and
- the first-layer to third-layer stacks of the third light-emitting element each comprise a corresponding one of the at least two second stack parts.

* * * * *